(12) United States Patent
Boulkenafed et al.

(10) Patent No.: US 10,176,404 B2
(45) Date of Patent: Jan. 8, 2019

(54) RECOGNITION OF A 3D MODELED OBJECT FROM A 2D IMAGE

(71) Applicant: DASSAULT SYSTEMES, Velizy Villacoublay (FR)

(72) Inventors: Malika Boulkenafed, Courbevoie (FR); Fabrice Michel, Grabels (FR); Asma Rejeb Sfar, Paris (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 0 days.

(21) Appl. No.: 15/370,997

(22) Filed: Dec. 6, 2016

(65) Prior Publication Data

US 2017/0161590 A1 Jun. 8, 2017

(30) Foreign Application Priority Data

Dec. 7, 2015 (EP) .................................... 15306952

(51) Int. Cl.
*G06K 9/00* (2006.01)
*G06K 9/62* (2006.01)
(Continued)

(52) U.S. Cl.
CPC .......... *G06K 9/6269* (2013.01); *G06F 17/50* (2013.01); *G06K 9/00208* (2013.01);
(Continued)

(58) Field of Classification Search
CPC ............... G06K 9/6269; G06K 9/6274; G06K 9/00208; G06K 9/6215; G06K 9/4628; G06F 17/50; G06N 3/04; G06N 3/08
See application file for complete search history.

(56) References Cited

U.S. PATENT DOCUMENTS

| 7,756,325 B2 * | 7/2010 | Vetter | G06K 9/00208 |
| | | | 345/419 |
| 2008/0232718 A1 * | 9/2008 | Avinash | A61B 6/032 |
| | | | 382/305 |

(Continued)

OTHER PUBLICATIONS

European Search Report dated Jun. 30, 2016 in European Application No. 15306952.1, 6 pages.

(Continued)

*Primary Examiner* — Samir Ahmed
(74) *Attorney, Agent, or Firm* — Oblon, McClelland, Maier & Neustadt, L.L.P.

(57) ABSTRACT

The invention notably relates to a computer-implemented method for recognizing a three-dimensional modeled object from a two-dimensional image. The method comprises providing a first set of two-dimensional images rendered from three-dimensional modeled objects, each two-dimensional image of the first set being associated to a label; providing a second set of two-dimensional images not rendered from three-dimensional objects, each two-dimensional image of the second set being associated to a label; training a model on both first and second sets; providing a similarity metric; submitting a two-dimensional image depicting at least one object; and retrieving a three-dimensional object similar to the said at least one object of the two-dimensional image submitted by using the trained model and the similarity metric.

15 Claims, 5 Drawing Sheets

(51) Int. Cl.
*G06F 17/50* (2006.01)
*G06N 3/04* (2006.01)
*G06N 3/08* (2006.01)
*G06K 9/46* (2006.01)

(52) U.S. Cl.
CPC ......... *G06K 9/6215* (2013.01); *G06K 9/6274* (2013.01); *G06N 3/04* (2013.01); *G06N 3/08* (2013.01); *G06K 9/4628* (2013.01)

(56) References Cited

U.S. PATENT DOCUMENTS

| | | | | |
|---|---|---|---|---|
| 2011/0075916 A1* | 3/2011 | Knothe | ............. | G06K 9/00201 382/154 |
| 2011/0182469 A1* | 7/2011 | Ji | ....................... | G06K 9/00335 382/103 |
| 2016/0026253 A1* | 1/2016 | Bradski | ................ | G02B 27/225 345/8 |

OTHER PUBLICATIONS

Q. Huang et al., "Single-View Reconstruction via Joint Analysis of Image and Shape Collections", in CVPR 2015, 10 pages.
T. Napoleon, "From 2D Silhouettes to 3D Object Retrieval: Contributions and Benchmarking", in. EURASIP Journal on Image and Video Processing, 2010, 17 pages.
Aono et al., "3D Shape Retrieval from a 2D Image as Query", In Signal & Information Processing Association Annual Summit and Conference (APSIPA ASC), 2012, 10 pages.
W. Svante, K. Esbensen, and P. Geladi, "Principal component analysis", Chemometrics and Intelligent Laboratory Systems 1987, 16 pages.
Babenko et al, "Neural Codes for Image Retrieval", 16 pages.
Bellet et al., "A Survey on Metric Learning for Feature Vectors and Structured Data", 59 pages.
Xing et al., "Distance Metric Learning with Application to Clustering with Side-Information", 8 pages.
Chopra et al., "Learning a Similarity Metric Discriminatively with Application to Face Verification", 8 pages.
Zagoruyko et al., "Learning to Compare Image Patches via Convolutional Neural Networks", 9 pages.
Krizhevsky et a.l, "ImageNet Classification with Deep Convulutional Neural Networks", 9 pages.
Melacci et al., *A Neural Network Approach to Similarity Learning*, 4 pages.
Peng et al., *Learning Deep Object Detectors from 3D Models*, 9 pages.

* cited by examiner

RECOGNITION OF A 3D MODELED OBJECT FROM A 2D IMAGE

CROSS-REFERENCE TO RELATED APPLICATIONS

This application claims priority under 35 U.S.C. § 119 or 365 to European Application No. 15306952.1, filed Dec. 7, 2015. The entire teachings of the above application(s) are incorporated herein by reference.

FIELD OF THE INVENTION

The invention relates to the field of computer programs and systems, and more specifically to a method, system and program for retrieving a three-dimensional (3D) object in a database of 3D objects from an image or photograph representing the object.

BACKGROUND

Existing three-dimensional (3D) object retrieval approaches may be categorized into (i) those operating directly on the 3D content and (ii) those which extract "2.5D" or 2D contents (stereo-pairs, multiple views of images, artificially rendered 3D objects, silhouettes, etc.).

Focusing now on "2D-to-3D" retrieval frameworks that are based on 2D image as input for performing the retrieval, several shape-based approaches, including boundary analyses, have been adapted for 3D object retrieval from 2D image(s).

For instance, T. Napoleon, "*From 2D Silhouettes to 3D Object Retrieval: Contributions and Benchmarking*", In. EURASIP Journal on Image and Video Processing, 2010, conducted 3D object search with multiple silhouette images. The query includes not only 2D silhouettes, but also hand-drawn sketches. Notably, this document introduced the idea of including silhouette/contour alignment using dynamic programming in a coarse-to-fine way for search efficiency. However, an important drawback of this method is that performance is sensitive to the quality of the contour resulting from automatic detouring, which remains a great challenge.

As another example of 3D retrieval from 2D images, Aono et al., "*3D Shape Retrieval from a 2D Image as Query*", In Signal & Information Processing Association Annual Summit and Conference (APSIPA ASC), 2012, uses a composite feature vector as a combination of Zernike moments and the HOG features for 3D object retrieval from a single 2D image. HOG features are computed from shaded depth-buffer images while Zernike moments from silhouette images. These features could not be sufficient to distinguish between similar objects with the same overall shape. Also, they often fail with partially occluded objects.

Other approaches to "2D-to-3D" matching utilize the 3D models for efficient object detection and/or fine pose estimation. For this, they rely on a collection of 3D exemplar models, which they render from a large number of viewpoints. The rendered images are then used for learning part templates to localize an object in a given image and estimate its fine-pose. The main drawback of such approaches is that they require heavy annotations and calculations. Thus are not scalable. For learning meaningful model, they need to associate each available CAD model to a set of images which contain the same CAD model and which are annotated with the object pose.

Querying a database of 3D objects with a 2D image has been also used for automatic 3D reconstruction of objects depicted in Web images, in Q. Huang et al., "*Single-View Reconstruction via Joint Analysis of Image and Shape Collections*", in CVPR 2015. The approach reconstructs objects from single views. The key idea is to jointly analyze a collection of images of different objects along with a smaller collection of existing 3D models. Dense pixel-level correspondences are established between natural images and rendered images. These correspondences are used to jointly segment the images and the 3D models. The computed segmentations and correspondences are then used to construct new models. However, such a method is sensitive to the quality of the segmentation and thus could fail with images with complex backgrounds and partially occluded objects.

Hence, these methods suffer several drawbacks. First they can require constraints on the image provided as input; for instance segmentation of the image, automatic detouring of the image. In addition, they do not always allow retrieving objects that are partially occluded. Furthermore, the scalability of these methods can be limited as they rely on learning machines that quickly reach their learning capabilities limits. Moreover, the discriminative power of the signatures used for retrieving the objects does not always allow relevant 3D objects; for instance these methods are not able to determine by themselves what makes the difference between two objects in a 3D model.

Within this context, there is still a need for an improved method for recognizing a three-dimensional modeled object from a two-dimensional image.

SUMMARY OF THE INVENTION

It is therefore provided a computer-implemented method for recognizing a three-dimensional modeled object from a two-dimensional image. The method comprises providing a first set of two-dimensional images rendered from three-dimensional modeled objects, each two-dimensional image of the first set being associated to a label; providing a second set of two-dimensional images not rendered from three-dimensional objects, each two-dimensional image of the second set being associated to a label; training a model on both first and second sets; providing a similarity metric; submitting a two-dimensional image depicting at least one object; and retrieving a three-dimensional object similar to the said at least one object of the two-dimensional image submitted by using the trained model and the similarity metric.

The method may further comprise one or more of the following:

- each two-dimensional image of the first set is computed from a viewpoint on a three-dimensional object, the viewpoint being selected among a plurality of viewpoints on the three-dimensional object;
- the plurality of viewpoints on the three-dimensional object is obtained from a Thomson sphere;
- after training the model: building an index of the two-dimensional images of the first set by extracting (S500) a feature vector for each two-dimensional image of the first set, wherein a feature vector is extracted using the trained model;
- an extracted feature vector comprises successive applications of parameters of the trained model to a two-dimensional image;
- extracting a feature vector of the submitted two-dimensional image.

comparing the extracted feature vector of the submitted two-dimensional image with the indexed feature vectors by using the similarity metric;

the similarity metric used for the comparison is deterministic;

the similarity metric used for the comparison is learned with a learning process;

the learning process comprises: training a similarity model on both first and second sets, each two-dimensional image of the first set being paired with a two-dimensional image of the second set and the labels associated with two-dimensional images of the first and second set comprising at least a similarity information label;

the extraction of the feature vector and the learning process of the similarity metric are concomitantly carried out by using a Siamese network;

the trained model is obtained with a Deep Neural Network.

It is further provided a computer program for recognizing a three-dimensional modeled object from a two-dimensional image, comprising instructions causing a processing circuitry to perform the above method.

It is further provided a computer readable storage medium having recorded thereon the computer program.

It is further provided a system comprising a processing circuitry coupled to a memory, the memory having recorded thereon the computer program.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
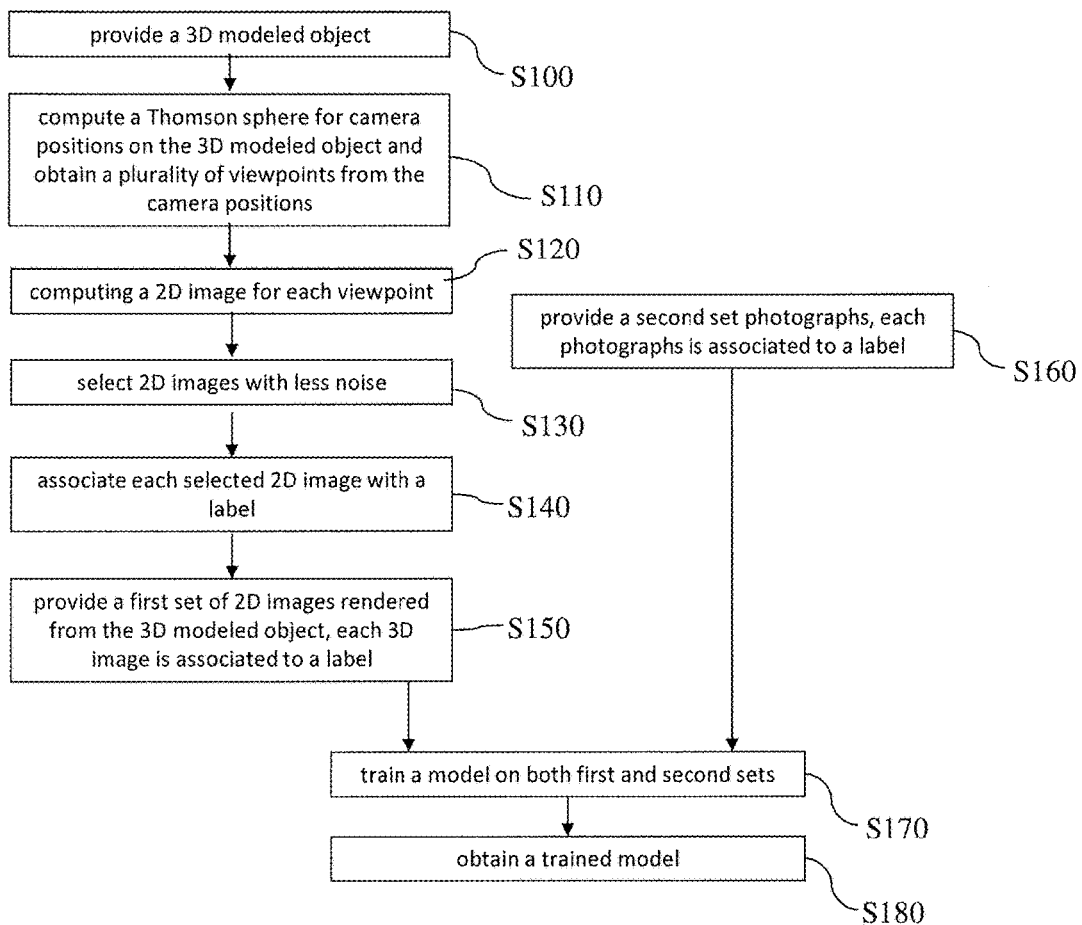
FIG. 1 shows a flowchart of an example of training a model.
Figure 5:
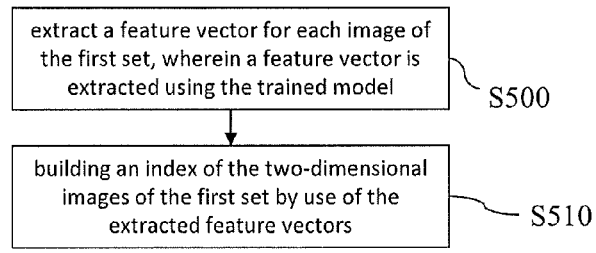
FIG. 5 shows a flowchart of an example of indexing 2D images.
Figure 7:
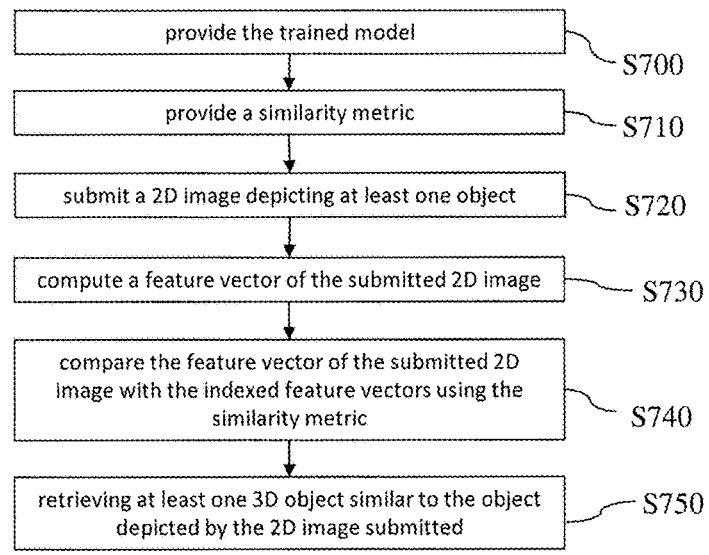
FIG. 7 shows a flowchart of an example of retrieving an object.

With reference to the flowcharts of FIGS. 1, 5 and 7, it is proposed a computer-implemented method for recognizing a three-dimensional (3D) modeled object from a two-dimensional (2D) image. The method comprises providing a first and a second sets of 2D images. The images of the first set are rendered from 3D modeled objects, and the images of the second set are not rendered from 3D modeled objects. Each 2D image of the first and second sets is associated to a label. The method also comprises training a model on both first and second sets; the model is typically a neural network model. The method further comprises providing a similarity metric. Then, the method comprises submitting a 2D image depicting at least one object. Next, the method comprises retrieving at least one 3D object similar to the one or more objects depicted by the 3D image previously submitted. The retrieval is carried out by using the trained model and the similarity metric. Such a method improves the identification of a 3D modeled object from a 2D image.

Notably, the present invention does not require any specific constraint to be applied on the input data (the 2D image) for retrieving a 3D modeled object. Indeed, the training of the model avoids performing segmentation for image content analysis, and it also avoid the occlusion problems encountered with methods using segmentation. The method is robust as the identification of the model relies on a trained model that is obtained from an end-to-end learning based on raw data: what is searched is what is known by the system. The scalability is also improved: indeed, deep neural network used for training the model does not have any limit with regards to it learning capacity (excepted when the system reaches 100% success of identification). Moreover, the method provides an efficient way to use deep learning with 3D objects. The way the model is trained allows to obtain signatures that are adapted to the type of the 3D objects that are stored. The discriminative power of the signatures is thus used for improving the relevance of the identified objects.

The method is computer-implemented. This means that the steps (or substantially all the steps) of the method are executed by at least one computer, or any system alike. Thus, steps of the method are performed by the computer, possibly fully automatically, or semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of the method is to perform the method with a system adapted for this purpose. The system comprises a processor coupled to a memory. It may further comprise a graphical user interface (GUI). Typically, the memory has recorded thereon a computer program comprising instructions for performing the method. The memory may also store a database. The memory is any hardware adapted for such storage, possibly comprising several physical distinct parts (e.g. one for the program, and possibly one for the database).

The 2D images of the first and second sets are typically stored on a "database". By database, it is meant any collection of data (i.e. information) organized for search and retrieval (e.g. a relational database, e.g. based on a predetermined structured language, e.g. SQL). When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

The method generally manipulates natural images and synthetic images obtained from modeled objects. A modeled object is any object defined by data stored e.g. in the database. By extension, the expression "modeled object" designates the data itself. The modeled objects may be defined by different kinds of data depending on the system with which an object has been modeled. The system may indeed be any of (or any of combination of) a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The 3D modeled object may represent the geometry of a product to be manufactured in the real world subsequent to the completion of its virtual design with for instance a CAD software solution or CAD system, such as a (e.g. mechanical) part or assembly of parts (or equivalently an assembly of parts, as the assembly of parts may be seen as a part itself from the point of view of the method, or the method may be applied independently to each part of the assembly), or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object used by the method may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

By PLM system, it is additionally meant any system adapted for the management of a modeled object representing a physical manufactured product (or product to be manufactured). In a PLM system, a modeled object is thus defined by data suitable for the manufacturing of a physical object. These may typically be dimension values and/or tolerance values. For a correct manufacturing of an object, it is indeed better to have such values.

By CAM solution, it is additionally meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systèmes under the trademark DELMIA®.

By CAE solution, it is additionally meant any solution, software of hardware, adapted for the analysis of the physical behavior of modeled object. A well-known and widely used CAE technique is the Finite Element Method (FEM) which typically involves a division of a modeled objet into elements which physical behaviors can be computed and simulated through equations. Such CAE solutions are provided by Dassault Systèmes under the trademark SIMULIA®. Another growing CAE technique involves the modeling and analysis of complex systems composed a plurality components from different fields of physics without CAD geometry data. CAE solutions allows the simulation and thus the optimization, the improvement and the validation of products to manufacture. Such CAE solutions are provided by Dassault Systèmes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systèmes under the trademark ENOVIA®.

Figure 10:
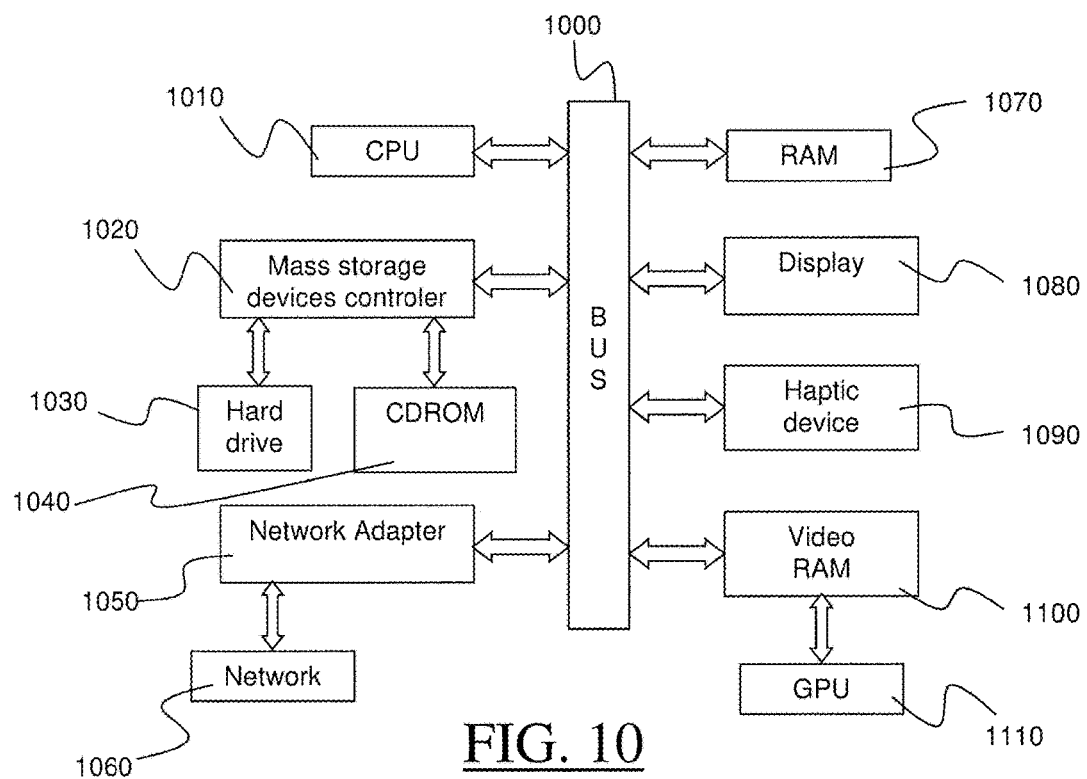
FIG. 10 shows an example of a computer system.

FIG. 10 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

"Recognizing a three-dimensional modeled object from a two-dimensional image" designates an action that may be at least part of a process of elaborating a 3D modeled object, e.g. designing a 3D modeled object. The method may be included in a manufacturing process, which may comprise, after performing the method, producing a physical product corresponding to the 3D modeled object retrieved. In any case, the modeled object recognized by the method may represent a manufacturing object, e.g. on a 3D printer. The 3D modeled object may thus be a modeled solid (i.e. a modeled object that represents a solid). The manufacturing object may be a product, such as a part, or an assembly of parts. Because the method improves the recognition of the 3D modeled object, the method also improves the manufacturing of a product and thus increases productivity of the manufacturing process.

Referring now to FIG. 1, it is discussed the creation of a trained model (S180). The trained model is obtained as a result of a training (S170) that is carried out on two provided set of 2D images (S150 and S160). The creation of the trained model is part of the so-called offline stage of the present invention, as opposed to the online stage illustrated on FIGS. 7 and 8. The expression offline refers to preprocessing operations that do not need to be carried out when the user queries the system to recognize a 3D modeled object represented in a picture; the result of the offline stage that is used by the online stage is already available to the online steps when the online stage is carried out. It is to be understood that the offline stage can run while the online stage is executed; in this case, the results of the offline stage that is used by the online stage are not the current result, but rather result of an offline stage previously executed. During the online stage, the user's query uses a 2D image that comprises an object that will be recognized among the 3D modeled objects. The offline stage is typically done once and for all, and it is transparent to the user. Alternatively, the offline stage can be run several time, e.g. it is run again for the purpose of enriching the trained model.

Preferably, the offline stage in the present invention relies heavily on the Deep Neural Networks and corresponds to the stage where all the features are learned and indexed. The offline stage can be considered as a two tiered process that uses a collection of media. The collection of media is preferably in the tens of thousands unit range, and the larger is the number of media in the collection, the sharper is the trained model. First, a signature is extracted for each and every media of the collection. The extraction process is typically repeated tens of thousands times; the number of repetition depends at least on the number of media in the collection of media. Second, a structured list is created. This list is usually referred to as an index containing all the signatures and the links to the actual media in the collection. The index is the data structure that allows a fast retrieval of the closest signature to a query. The term feature can be used for designating the signature, that is, the feature are derived values of the provided collection of media and are intended to be informative, non-redundant, facilitating the subsequent learning.

The offline stage provides an efficient way to leverage the efficiency of 2D object categorization (also called classification) methods, namely the Deep Neural Networks (DNNs). DNNs are a set of techniques for learning in Neural Networks which is a biologically-inspired programming paradigm enabling a computer to learn from observational data. DNNs are discussed in Rumelhart et al., "*Learning internal representations by error backpropagation*", 1986. DN Ns are focused on end-to-end learning based on raw data. In other words, they move away from feature engineering to a maximal extent possible, by accomplishing an end-to-end optimization starting with raw features and ending in labels. Categorization is the problem of identifying to which of a set of categories a new observation belongs, on the basis of a training set of data containing observations (or instances) whose category membership is known. An example of categorization would be: assigning a given song into its music style or assigning a diagnosis to a given patient as described by observed characteristics of the patient. In other words, classifying an unseen sample consists of learning the parameters of a model that will recover its category (i.e., label) accurately, given a training set with labeled samples.

Figure 4:
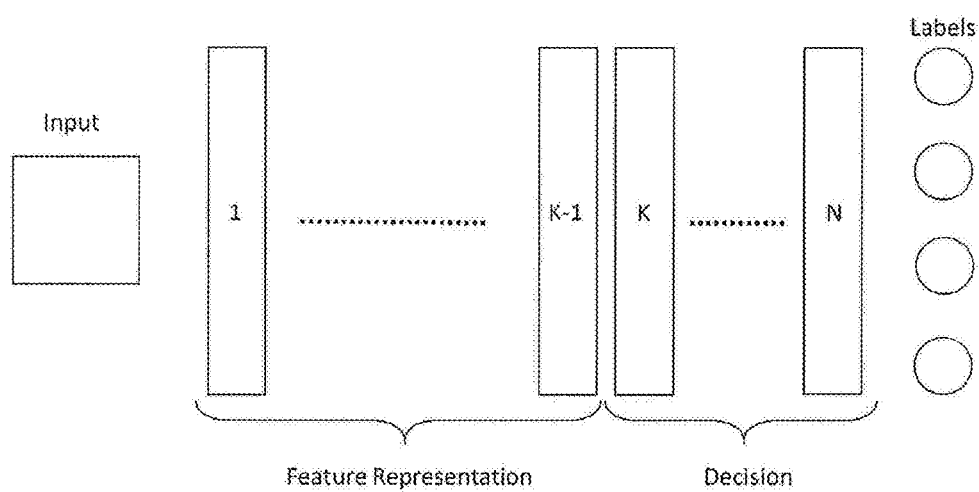
FIG. 4 shows an example of a deep neural network architecture.

FIG. 4 shows an example of a DNN architecture. Data are provided on input of the DNN, and a cascade of layers 1 to K−1 process the data for feature extraction and transformation. Each layer uses the output from the previous layer as input, and possibly the previous layer may receive the output of the next layer. At each layer, higher level features are derived from lower level features to form a hierarchical representation of features. Features vectors can be extracted for each layer from the feature. Next, a categorization of the data provided at input of the DNN is obtained with the successive layers K to N. A match occurs between the label of the data provided at input and the result of the categorization when the parameters of the DNN are correctly trained.

It is now discussed how two sets of 2D images used for training the model are provided at steps S150 and S160.

The steps S100 to S150 are an example for providing a first set of 2D images rendered from a 3D modeled object, wherein each 3D image is associated to a label. At step S100, a 3D modeled object is provided. Providing a 3D modeled object means that the system that performs the offline stage can access data that allows 3D representation of the object, as defined above. This is performed, e.g. by providing an access to a database that stores at least one 3D modeled object.

Next, at steps S110 to S130, 2D images are computed from the 3D modeled object provided at step S100. These computed 2D images are rendered from the 3D modeled object; said otherwise, the 2D images obtained at steps S110 to S130 are synthetic images. A synthetic image (or rendered image) is an image that is computed by a render engine. Thus, the synthetic image does not comprise the same noise as the one a photograph (also referred to as natural image) would comprise, e.g. diffraction, noise of the image sensor, distortions such as barrel distortion, lighting of the object and the surrounding objects . . . . Hence, the signature of a photograph varies depending on the camera that took the picture, while the signature of a synthetic image is the same on any computer.

For a provided 3D modeled object, several viewpoints are determined, thus forming a plurality of viewpoints on the 3D modeled objects. At least one viewpoint is selected and an image is computed according to the selected viewpoint. Here the term viewpoint means a specific location in a 3D scene (the 3D modeled object is located and rendered in the 3D scene) at which the camera is placed to take a shot, as known in the art.

The determination of the viewpoints in performed as known in the art. This can be made upon user action, e.g. the user selects camera position by use of haptic device. Preferably, this can be performed by use of a space discretization that is able to fix the different camera positions for the 3D rendering in the 3D scene wherein the 3D modeled object is located.

Figure 2:
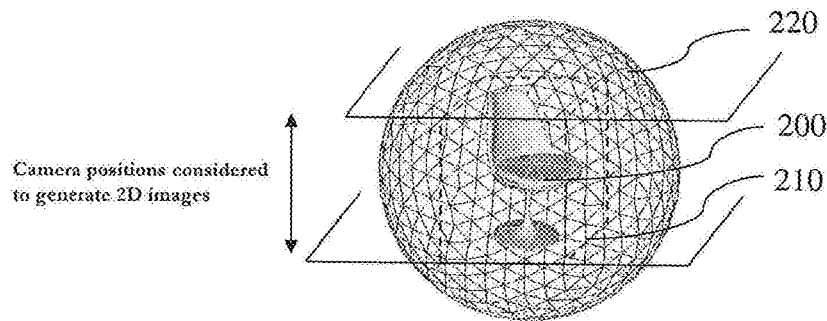
FIG. 2 shows an example of a Thomson sphere for camera positions.

Several space discretization methods exist in the literature. In an example, implementation, a Thomson sphere is used (step S110). The Thomson sphere is the bounding sphere of the 3D modeled object discretized using the Thomson problem, as discussed J. J. Thomson, Philosophical Magazine 7, 237, 1904. FIG. 2 shows a 3D modeled object 200 (a chair) that is surrounded by a bounding box 210. The 3D modeled object 200 and the bounding box 210 are enclosed in a bounding sphere 220; they are completely enclosed, which means that no part of the 3D modeled object is outside the bounding sphere. It is to be understood that the bounding box 210 is not mandatory for using the Thomson sphere. The Thomson sphere contains a number M of camera positions.

Once the viewpoints have been identified, a 2D image is rendered (S120) for each identified viewpoint. The rendering is performed as known in the art.

The number N of 2D images rendered from a 3D modeled object is the same as the number M of viewpoints. However, this number M of viewpoints may be huge and some 2D images obtained from viewpoints can be noisy for the training, that is, useless. In order to limit the number of viewpoints, the positions of the camera can be comprised between the top and the bottom facet of the object bounding box to generate 2D images. This allows decreasing the number of 2D image to compute while providing only relevant 2D images for the training. In addition, even if the number of viewpoint has been decreased and viewpoints providing the less noisy 2D images have been selected, there can be still 2D images that are too noisy for the training. A selection (S130) can therefore be performed on the rendered 2D image in order to keep only the 2D images with less noise. This can be performed by the user. In another example, the reduction of the number of 2D images can be done without user's action. Indeed, for a dataset of aligned 3D modeled objects, one can directly consider a specific interval of positions, namely camera positions which are comprised between T/2 and B/2, where T is the top facet of the object bounding box and B is the bottom facet of the object bounding box.

Figure 3:
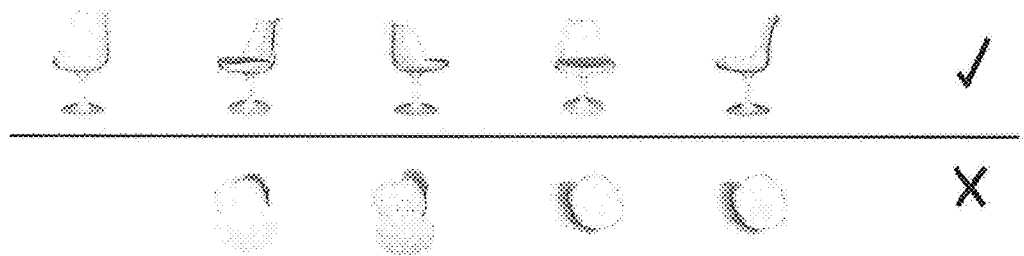
FIG. 3 shows an example of views generated for one 3D object based on a Thomson sphere for camera positions.

FIG. 3 shows an example of ten views of the 3D modeled object 200 of FIG. 2. It is to be understood that the number of 2D images is in general more than ten; e.g. around a hundred images may be generated for each 3D model. The exact number depends on the size of each object (i.e., on the bounding box or any other bounding volume of the 3D modeled object). The top five view are considered being relevant as the chair 200 can be easily recognized, while the five views at the bottom do not allow an easy recognition of the chair. Thus, only reasonable views are considered. The five views at the bottoms are those that were not comprised between the top and the bottom facet of the object bounding box of FIG. 2.

Next, at step S140, each image is associated with a label; or said otherwise, each image is categorized by use of label. A label is meaningful tag, category, or ID that is informative or that provide an information desirable to know about the image. For example, a label might be, but is not limited to, whether the image contains a chair or a table or what type of action is being performed in a video. Thus a label can provide a description of the content of the image. In practice, the label is added by a user that categorizes all the 2D images rendered from the 2D modeled object.

Thus, at step S150, a first set of 2D images rendered from the provided 3D modeled object and labelled is obtained. This first set is provided to the training system used for obtaining a trained model.

At step S160, a second set of 2D images is provided to the training system, e.g. a DNN. The 2D images of the second set are photographs, that is, natural images. As discussed above, the natural images are not rendered from a 3D modeled objects and their signatures vary (for a same object) depending at least of the camera that took the picture. The noise of a natural image depends on the conditions in which the image was taken. Typically, the 2D images or photographs are complex photos of objects with different resolutions, backgrounds and contexts.

Then, at step S170, a model is trained from the first and second set of images. The training is typically performed on a Deep Neural Network that is generally used within a classification framework. In an example, a Convolutional Neural Network (CNNs) is used. CNNs are discussed in Y. Lecun et al., "*Backpropagation applied to handwritten zip code recognition*", Neural Comput, 1989. Convolutional Neural Networks are neural networks that use convolution in place of general matrix multiplication and have demonstrated their efficiency to recognize objects from complex scenes in images with cluttered background and multiple other objects. In another example, the CNN that is used is the CNN that is called AlexNet (AlexNet has been discussed in Alex Krizhevsky, "*ImageNet Classification with Deep Convolutional Neural Networks*", NIPS 2012. Preferably, the AlexNet CNN is adapted to the present invention by modifying the number of neurons of the last layer which corresponds to the number of categories considered, e.g. 1000 neurons. The AlexNet CNN consists of five convolutional layers (with pooling and normalization) and three full-connected layers.

The training of the model notably comprises learning the parameters of the DNN. The parameters emerging in the upper layers of a DNN such as a CNN learned to classify images can serve as good descriptors for image retrieval. The parameters are learned on large number of both rendered images (the 2D images of the first set) and not rendered images (the 2D images of the second set).

Then, at step S180, a trained model is obtained. The trained model is a set of learned DNN parameters. The DNN parameters are also referred to as neural codes, as discussed in Babenko et al, "*Neural Codes for Image Retrieval*".

Figure 6:
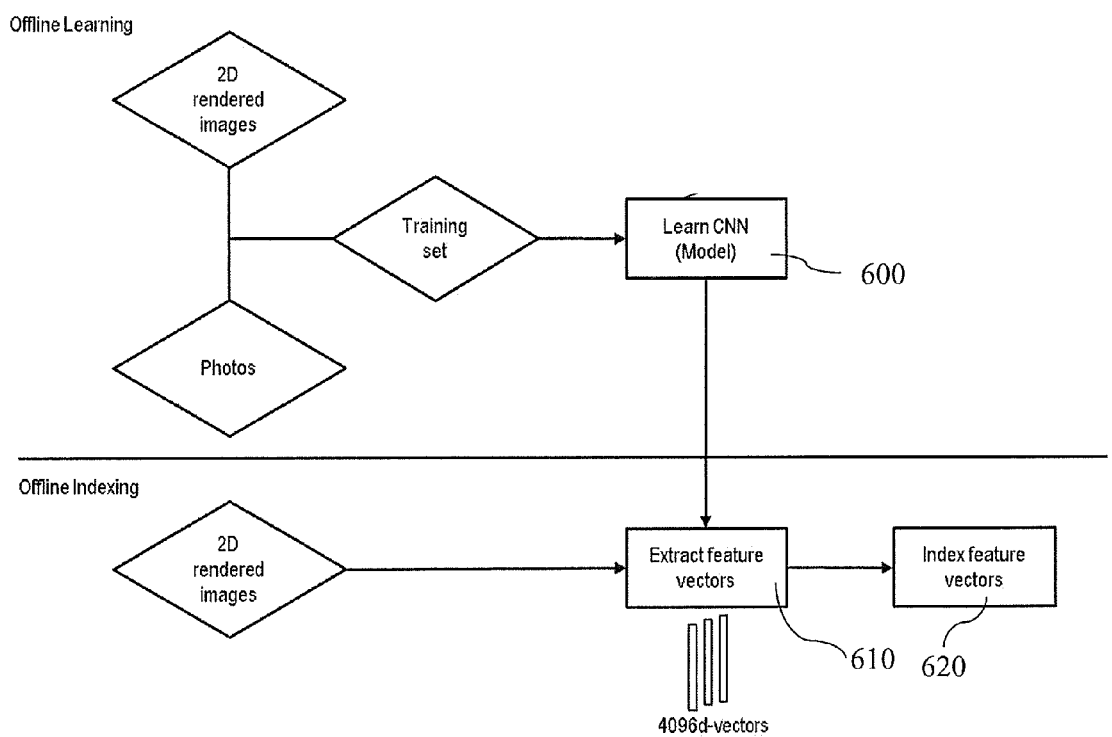
FIG. 6 shows an example of offline learning and indexing.

The offline learning of steps S100 to S180 is represented on top of FIG. 6. Notably, the training set of a DNN (a CNN in the example of this figure) comprises 2D images provided by the first and second sets. No constraint is required for the both kinds of images. In practice, the training dataset consists of one quarter (¼) of rendered images and three quarters (¾) of photos; this allows improving the classification results of the DNN. Other combinations of images might be considered. The best results have been obtained with a training dataset comprising one quarter of rendered images and three quarters of photos. The training set is provided to the DNN learner 600 which hosts the DNN and computed the model obtained at step S180. The DNN learning machine 600 is typically a software application, and is implemented as known in the art.

FIG. 5 shows a second aspect of the offline stage: the creation of an index of features vectors extracted from the first set of 2D images, that is, the images rendered from 3D modeled objects. The natural images (the 2D images of the second set) are used only for training the model, not for the search. The neural codes (or feature vectors) of each 2D image can be extracted (S500) and used as a feature vectors. The feature vectors are extracted using the trained model at step S180. The extraction of the features is performed by applying a "forward pass" to the input image using the set of learned parameters. That is the image is passed through the different layers which are parameterized with the leaned parameters. Thus, the extracted feature vector comprises successive applications of parameters of the trained model to a given two-dimensional image, e.g. the 2D rendered image provided. The neural codes may belong to one or more hidden layers of the DNN; the more layers of the DNN are considered, the more discriminative but longer is the feature vector obtained. For each feature vector extracted from a 2D image, it is determined whether the size of the feature vectors is too long. The size of the feature vector can have an impact on memory usage and/or overall system performance. The size of a feature vector can be up to several MegaBytes. In practice, the best tradeoff between global performances of the system and discriminative characteristics of the feature vectors have been obtained with features vectors of a size of four KiloBytes. In the event the size of the feature vector is determined as exceeding a given size, a reduction of the feature vector can be performed. Different dimensionality reduction methods may be applied to reduce the feature vectors size, as known in the art; for instance a Principal Component Analysis may be used as described in W. Svante, K. Esbensen, and P. Geladi, "*Principal component analysis*", Chemometrics and Intelligent Laboratory Systems 1987.

Once a feature vector have been extracted (step S500), the 3D modeled object from which the corresponding 2D image have been rendered is indexed by using the extracted feature vector. It is to be understood that the corresponding 2D image is the 2D rendered image from which the feature vector have been extracted. The index is a data structure that allows improving location speed of data. The building of the data structure is performed as known in the art.

The offline indexing of steps S500 to S510 is represented at the bottom of FIG. 6. 2D images rendered from 3D modeled objects are provided to a feature vector extractor 610, and the extracted features vectors are transmitted to a feature vector indexer 620 that build the index of feature vectors. In an example of FIG. 6, the second to last fully-connected layer of the neural network is extracted. Still in this example, the neural network is a AlexNet CNN, and, this second to last layer contains 4096 neurons. From each 2D rendered image, 4096-dimensional feature vector is extracted.

Figure 8:
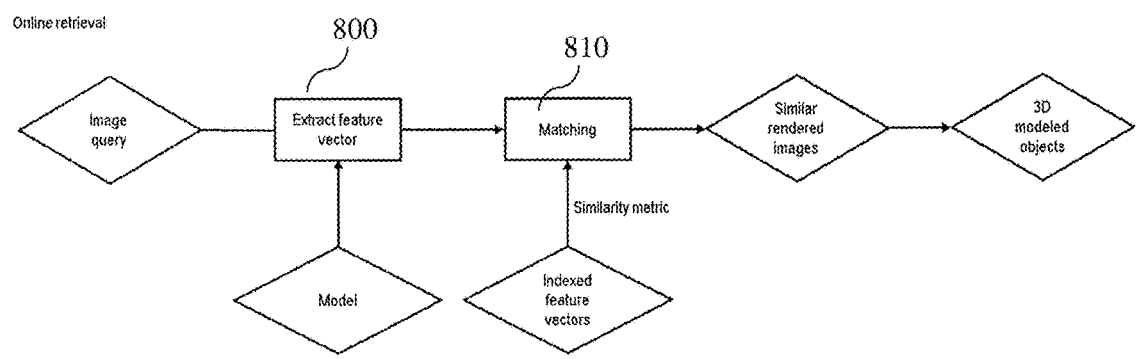
FIG. 8 shows an example of online retrieving of an object.

In reference now to FIGS. 7 and 8, it is discussed the online stage that is performed; the online stage aims at identifying at least one 3D modeled object from a 2D image that contains an object.

In the example of FIG. 7, the online stage starts with providing (S700) a trained model, e.g. the trained model obtained at step S180.

Then, a similarity metric is provided (S710). The similarity metric allows performing a similarity measure between a 2D image that depicts at least one object and the 3D modeled objects that are stored, e.g. in a database of 3D modeled objects. Mathematically, the notion of similarity is equivalent to the notion of inner product, and as such is directly proportional to the distance between vectors in a normed vector space. The notions of similarity and distance are often interchangeable, as a simple transformation gets from one to the other.

The similarity metric may be provided upon user action, or it may be provided by default (e.g. an automatic selection of the similarity metric) is performed by the system, or it may be provided by default and modified by the user at a later stage.

The similarity metric may be a deterministic similarity metric. Deterministic similarity metrics are parameter-less similarity metrics, or if there are parameters to the similarity metrics, they are chosen by an operator and not by means of an automatic process. Among deterministic similarity metric, one can provide one among an Euclidean distance, a Manhattan distance, a cosine similarity. The cosine similarity is equivalent to the Euclidean distance between normed vectors.

The similarity may be a learned similarity. Learned similarities are widely discussed in the literature, and this field is also referred Metric Learning. For instance, a survey on Metric Learning methods can be found in Bellet et al., "*A Survey on Metric Learning for Feature Vectors and Structured Data*". The idea behind metric learning methods is to set the parameters of a metric using a database of annotated pairs (or even sometimes triplets). The database is divided into two types of pairs, the similar pairs and the dissimilar ones. Metric Learning methods aim at tuning the parameters of the metric so as to mimic closely the similarity relationship in the database i.e. the distance between two similar objects is always smaller than the distance between two dissimilar objects.

One of the first method in metric learning is looking at modifying the parameters of a Mahalanobis distance as discussed in Xing et al., "*Distance Metric Learning with Application to Clustering with Side-Information*". In this case, the distance is expressed by the equation 1:

$$d(x,y) = \sqrt{(x-y)^T \Sigma (x-y)}$$

where d(x, y) is a distance metric between points x and y, and where the matrix of parameters Σ is found through an optimization process. If the matrix of parameters Σ is the identity, then the distance d is the Euclidean distance.

In another method in metric learning, the metric learning problem can also be viewed as a space embedding problem, one performs a space embedding into a space in which similar elements are closer than dissimilar elements regarding deterministic similarity. Such space embedding can be done in the Hamming space—the Hamming space is the space of binary vectors and it is usually the set of all $2^N$ binary strings of length N—, and the distance is then the Hamming distance, which is the Manhattan distance evaluated in the Hamming space. The space embedding is then a function that transforms any feature vector in a binary code vector that keeps the similarity relationship in the database.

After the selection of a similarity metric, a 2D image is provided to the system (S720). The 2D image depicts at least one object, e.g. a manufactured object of the real world. The 2D image may be a natural image (a photograph) or a 2D image rendered from a 3D modeled object. The image is typically provided upon user action; the user selects an image, and this selected image is provided to the system that will perform the query. The selection of the image is carried out as known in the art, e.g. the user uses a haptic device for selecting an image file. The image may be alternatively provided automatically to the system that will perform the query. Providing the 2D image means that the data representing the 2D image are available to the query system. The 2D image can be comprise raster graphics or a vector graphic; for the latter, the vector graphics of the image will be transformed into raster graphics. Hence, all kind of 2D images can be provided at step S720.

Once the 2D image depicting at least one object has been submitted, the system extracts a feature vector of the 2D image (S730). The extraction is performed as known in the art; an algorithm dedicated to the extraction of features is applied on the 2D image.

Next, the computed feature vector of the 2D image provided at step S720 is compared (S740) with the feature vectors of the index that was built at step S500-S510. This comparison is made as known in the art. The comparison uses the provided similarity metric in order to determine what is (or are) the closest feature vectors that are indexed. Thus, one or more matching are obtained between the extracted feature vector of the 2D image provided at step S720 and one or more feature vectors of the index. It is to be understood that no matching can be determined if the discrepancies between the provided 2D image and the 3D modeled objects indexed are too important. For instance, a very low similarity metric value means no match.

Then, for each feature vector of the index that matches with the extracted feature vector of the 2D image provided at step S720, one or more 3D modeled objects can be identified: the index is a structured list that contains all the signatures (the feature vectors) and the links to the actual media in the collection (the 3D modeled object from which the 2D image associated with a signature have been rendered). Hence, on or more 3D objects that are similar to the object depicted in the image submitted at step S720 are retrieved (S750). Retrieving means that at least the minimal information that allows the system to access the 3D object is provided, e.g. a link to the data of the 3D object. The retrieval of the 3D object may further comprise the download on the client computer of the data of the 3D object, or the display of one or more 2D image of the 3D object retrieved. Here, the client computer is the computerized system on which the result of the retrieval has to be displayed; in practice, the client computer is the computer on which the 2D image was provided for triggering the search of similar 3D modeled objects.

FIG. 8 shows an example of the online stage. An image query is triggered by providing the 2D image. The feature vector of the 2D image is extracted by use of the trained model during offline stage. The extraction is made by a feature vector extractor 800 that can be the same of the one 610 of FIG. 6. The extracted feature vector is then sent to a matching module 810 that is in charge of computing the similarities between the feature vectors according to a similarity metric. The matching module 810 can access the index of feature vectors for performing the comparisons. The matching module 810 provides at its output a list of one or more feature vectors (S740); being understood that the list can be empty if no match was determined.

Another example of metric learning is now discussed which involves a particular architecture adapted for performing concomitantly the offline indexing and the metric learning. This architecture is depicted on FIG. 9 and relies on Siamese networks that are discussed in Chopra and al., "*Learning a Similarity Metric Discriminatively with Application to Face Verification*". Siamese networks allows learning the similarity through a neural network. Siamese networks have two identical parts that create a nonlinear embedding then, the Euclidean or the Manhattan distance between both representations is taken, if the distance does not resemble the database then the weights in the neural network are amended accordingly through an optimization process. Several additions and modifications have been and can be made to Siamese networks in the context of images, as discussed in Zagoruyko et al., "*Learning to Compare Image Patches via Convolutional Neural Networks*".

Figure 9:
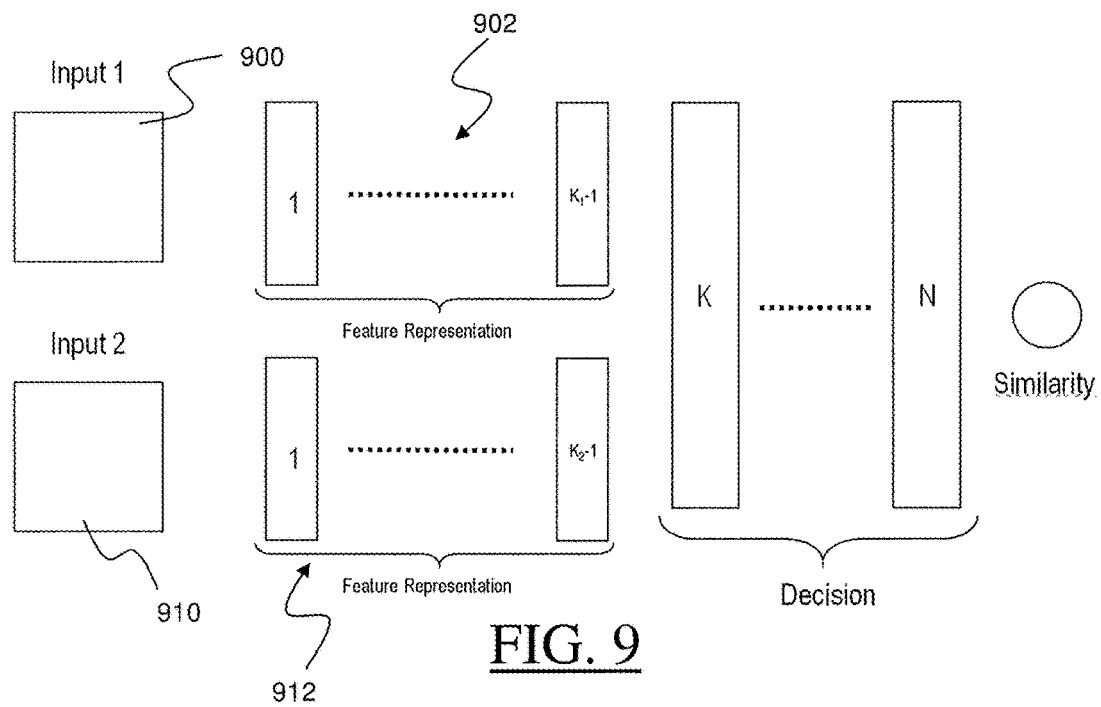
FIG. 9 shows an example of a deep Siamese architecture.

In the Deep Siamese Architecture of FIG. 9, the feature extraction process and the learning of a distance metric are integrated. The distance metric might be learned and two learning processes might happen simultaneously with two different learning databases, e.g. the databases 900 and 910 that comprises the first and second sets of images. In the present invention, the learning process is integrated by the use of Siamese networks, in which case only one learning happens. The learning databases 900 and 910 provides 2D images to their respective feature extraction networks—the cascade of layers 1 to K−1. The feature extraction networks are connected to the bottom of each of the Siamese network branches, and back-propagation is used to learn at the same time the feature vectors and the distance metric. This allows engineering a better feature for the comparison task at hand. The model is trained with 2D images that are paired, one 2D image of the pair belongs to the first set and the second one belong to the second set. The two images of a pair are labelled, and the label comprises at least similarity information. A similarity information can represent a tag such as <<highly similar>>, <<highly dissimilar>>. Two images which belong to the same category (e.g., chair) can be considered as highly similar. Images that belong to different categories can be considered as highly dissimilar. When the similarity result provided at the output of the architecture is the same as the one in the label of the pairs of 2D images, the parameters of the decision layers K to N are correctly tuned, and these tuned parameters are the learned metric.

The preferred examples of the present invention have been described. It will be understood that various modifications may be made without departing from the spirit and scope of the invention. Therefore, other implementations are within the scope of the following claims. For instance, the collection of 3D objects can be stored on the client computer, or it can be stored on a dedicated server to which the client computer is connected, e.g. through a communication network. The trained model is preferably stored on the server hosting the 3D objects, as well as the index.

The invention claimed is:

1. A computer-implemented method for recognizing a three-dimensional modeled object from a two-dimensional image, comprising:
   obtaining a first set of two-dimensional images rendered from three-dimensional modeled objects, each two-dimensional image of the first set being computed from the three-dimensional modeled objects and being associated with a label before being obtained;
   obtaining a second set of two-dimensional images not rendered from three-dimensional objects, each two-dimensional image of the second set being associated to a label;
   training a model on both first and second sets;
   obtaining a similarity metric;
   submitting a two-dimensional image depicting at least one object; and
   retrieving a three-dimensional object similar to the said at least one object of the two-dimensional image submitted by using the trained model and the similarity metric.

2. The computer-implemented method of claim 1, wherein each two-dimensional image of the first set is computed from a viewpoint on a three-dimensional object, the viewpoint being selected among a plurality of viewpoints on the three-dimensional object.

3. The computer-implemented method of claim 2, wherein the plurality of viewpoints on the three-dimensional object is obtained from a Thomson sphere.

4. The computer-implemented method of claim 1, further comprising, after training the model:
   building an index of the two-dimensional images of the first set by extracting a feature vector for each two-dimensional image of the first set, wherein a feature vector is extracted using the trained model.

5. The computer-implemented method of claim 4, wherein an extracted feature vector comprises successive applications of parameters of the trained model to a two-dimensional image.

6. The computer-implemented method of claim 4, further comprising:
   extracting a feature vector of the submitted two-dimensional image.

7. The computer-implemented method of claim 6, further comprising:
   comparing the extracted feature vector of the submitted two-dimensional image with the indexed feature vectors by using the similarity metric.

8. The computer-implemented method of claim 7, wherein the similarity metric used for the comparison is deterministic.

9. The computer-implemented method of claim 7, wherein the similarity metric used for the comparison is learned with a learning process.

10. The computer-implemented method of claim 9, wherein the learning process comprises:
    training a similarity model on both first and second sets, each two-dimensional image of the first set being paired with a two-dimensional image of the second set and the labels associated with two-dimensional images of the first and second set comprising at least a similarity information label.

11. The computer-implemented method of claim 9, wherein the extraction of the feature vector and the learning process of the similarity metric are concomitantly carried out by using a Siamese network.

12. The computer-implemented method of claim 1, wherein the trained model is obtained with a Deep Neural Network.

13. A non-transitory computer readable medium having stored thereon a computer program for recognizing a three-dimensional modeled object from a two-dimensional image, comprising instruction causing processing circuitry to perform the method comprising:
    obtaining a first set of two-dimensional images rendered from three-dimensional modeled objects, each two-dimensional image of the first set being computed from the three-dimensional modeled objects and being associated with a label before being obtained;
    obtaining a second set of two-dimensional images not rendered from three-dimensional objects, each two-dimensional image of the second set being associated to a label;
    training a model on both first and second sets;
    obtaining a similarity metric;
    submitting a two-dimensional image depicting at least one object; and
    retrieving a three-dimensional object similar to the said at least one object of the two-dimensional image submitted by using the trained model and the similarity metric.

14. A system comprising a processing circuitry coupled to a non-transitory memory, the non-transitory memory having recorded thereon the computer program of claim 13.

15. The computer-implemented method of claim 1, wherein each two-dimensional image of the first set is computed from a viewpoint on a three-dimensional object, the viewpoint being selected among a plurality of viewpoints on the three-dimensional object,
    wherein the plurality of viewpoints on the three-dimensional object is obtained from a Thomson sphere, and
    wherein the method further comprises, after training the model:
    building an index of the two-dimensional images of the first set by extracting a feature vector for each two-dimensional image of the first set, wherein a feature vector is extracted using the trained model.

* * * * *